(12) United States Patent
Higuchi et al.

(10) Patent No.: US 6,522,361 B2
(45) Date of Patent: *Feb. 18, 2003

(54) ELECTRONIC APPARATUS HAVING THE FUNCTION OF DISPLAYING THE BATTERY RESIDUAL QUANTITY AND METHOD FOR DISPLAYING THE BATTERY RESIDUAL QUANTITY

(75) Inventors: Yoshinari Higuchi, Tokyo (JP); Toshio Koyama, Kanagawa (JP); Naoki Nagano, Tokyo (JP); Yoichi Tsusue, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/810,989

(22) Filed: Feb. 27, 1997

(65) Prior Publication Data

US 2001/0008424 A1 Jul. 19, 2001

(30) Foreign Application Priority Data

Mar. 8, 1996 (JP) ............................................. 8-051790

(51) Int. Cl.$^7$ ............................................. H04N 5/225
(52) U.S. Cl. .................. 348/372; 348/333.13; 320/114; 320/106; 320/132
(58) Field of Search ................................ 348/333, 346, 348/372, 373; 320/114, 127, 106, 132, DIG. 21, DIG. 18

(56) References Cited

U.S. PATENT DOCUMENTS 5,206,097 A   4/1993   Burns et al. ................ 429/114

(List continued on next page.)

FOREIGN PATENT DOCUMENTS

| EP | 0 593 198 A | 4/1994 |
| EP | 0 616 281 A | 9/1994 |
| EP | 0 622 863 A | * 11/1994 |

OTHER PUBLICATIONS

Nagai, Y. et al: "DC Switching Power Supply System Including Monitoring of the Battery" Proceedings of the International Telecommunications Energy Conference. (Intelec), Firenze, Oct. 15–18, 1989, vol. 1, No. Conf. 11, Oct. 15, 1989, Institute of Electrical and Electronics Engineers, pp. 11.5 1–08, XP00013008.

*Primary Examiner*—Wendy R. Garber
*Assistant Examiner*—Jacqueline Wilson
(74) *Attorney, Agent, or Firm*—Frommer Lawrence & Haug LLP; William S. Frommer

(57) ABSTRACT

An electronic equipment having the function of displaying the battery residual quantity for displaying the usable residual time of a battery pack used as a power source of the electronic equipment. The equipment is designed to cope with different types or future version of the battery cell. The residual usable time of the battery can be known with improved display accuracy. The video camera 60 carries a battery pack 1 outputting at least the information on the residual battery capacity, charging/discharging current detection information and the battery cell voltage detection information. The video camera 60 includes a micro-computer 63 having a communication circuit 65 for receiving the above information from the battery pack 1, a calculation circuit 66 for calculating the current residual battery capacity based on the information from the battery pack 1 received by the communication circuit 65, and a display control circuit 67, and a display device 64 fed with a display signal corresponding to the results of calculations by the calculation circuit 66 of the micro-computer 63 for displaying the residual battery capacity based on the display signal.

35 Claims, 12 Drawing Sheets

U.S. PATENT DOCUMENTS

| | | | |
|---|---|---|---|
| 5,248,929 A | * 9/1993 | Burke | 320/127 |
| 5,315,228 A | 5/1994 | Hess et al. | 320/106 |
| 5,477,129 A | * 12/1995 | Myslinski | 320/2 |
| 5,559,554 A | * 9/1996 | Uekane et al. | 348/321 |
| 5,742,341 A | * 4/1998 | Ohishi et al. | 348/373 |
| 5,955,869 A | * 9/1999 | Rathmann | 320/132 |
| 6,008,620 A | * 12/1999 | Nagano et al. | 320/106 |
| 6,018,228 A | * 1/2000 | Dias et al. | 320/106 |
| 6,034,507 A | * 3/2000 | Ikawa et al. | 320/132 |

\* cited by examiner

|  | POWER SAVE=OFF | | | POWER SAVE=ON | | | |
|---|---|---|---|---|---|---|---|
|  | PANEL OPENED | PANEL CLOSED | PANEL REVERSED | PANEL OPENED | VIEWFINDER USED; PANEL CLOSED | VIEWFINDER NOT USED; PANEL CLOSED | VIEWFINDER USED; PANEL REVERSED | VIEWFINDER NOT USED; PANEL REVERSED |
| LC PANEL ON/OFF | ON | OFF | ON | ON | OFF | OFF | ON | ON |
| EVF ON/OFF | OFF | ON | ON | OFF | ON | OFF | ON | OFF |

FIG.11

ELECTRONIC APPARATUS HAVING THE FUNCTION OF DISPLAYING THE BATTERY RESIDUAL QUANTITY AND METHOD FOR DISPLAYING THE BATTERY RESIDUAL QUANTITY

BACKGROUND OF THE INVENTION

1. Field of the Invention

This invention relates to an electronic equipment having the function of displaying the battery residual quantity for displaying the usable residual time of a battery pack used as a power source of the electronic equipments, such as a video camera, portable telephone or a personal computer. The invention also relates to a method for displaying the battery residual quantity.

2. Description of the Related Art

Up to now, a battery pack constituted by a secondary cell, such as a lithium ion cell, NiCd cell or a nickel hydrogen cell, is well-known.

In many of this known type of the battery pack, there are enclosed a micro-computer for calculating the battery residual quantity for having communication with an electronic equipment having the battery as the power source, a peripheral circuit for the micro-computer and a battery cell status detection circuit required for the micro-computer to execute the calculations of the battery residual quantity.

On a variety of electronic equipments loaded with the above-mentioned battery packs, a display device is sometimes mounted for displaying the residual battery capacity. In many of the conventional electronic equipments, having this sort of the display device, the residual battery capacity is calculated and displayed on the basis of the terminal voltage of the battery power source (terminal voltage of the battery pack).

However, with the method for calculating the residual battery capacity from the terminal voltage of the battery power source, the following problems arise.

First, if discharging properties, that is the battery terminal voltage to discharging voltage characteristics, differ with the types of the battery cell, it is necessary to have an equation for conversion from the terminal voltage to the residual battery capacity from one battery cell to another, such that it is difficult to cope with future versions of the battery cell.

Second, the residual battery capacity after all specifies the ratio in percentage of the residual capacity to capacity of the fully charged battery, while the remaining usable time of the battery cannot be known from it.

Third, in the current state of the art, the residual battery capacity can be grasped from the discharge characteristics only roughly by gross levels, such as in four stages.

SUMMARY OF THE INVENTION

It is therefore an object of the present invention to provide an electronic equipment having the function of displaying the battery residual quantity, and a method for displaying the battery residual quantity, whereby it is possible to accommodate different types of the battery cell or future versions of the battery cell, while it is also possible to know the usable residual service life of the battery with high display accuracy.

With the electronic equipment having the function of displaying the residual battery capacity and the method for displaying the residual battery capacity according to the present invention, the information on the residual battery capacity, charging/discharging current detection information and the battery cell voltage detection information from the battery pack are received, the current residual battery capacity is calculated based on the received information, and the residual battery capacity is displayed based on the results of calculations.

That is, according to the present invention, the information on the residual battery capacity, charging/discharging current detection information and the battery cell voltage detection information are sent from the battery pack to the electronic equipment, which then calculates the residual battery capacity from the received information for display. Thus it becomes possible to accommodate different types of the battery cell or future versions of the battery cell, while it is also possible to know the usable residual service life of the battery with high display accuracy.

BRIEF DESCRIPTION OF THE DRAWINGS

FIG. 11 illustrates on/off control of the liquid crystal display panel and a viewfinder.

DESCRIPTION OF THE PREFERRED EMBODIMENTS

Figure 1:
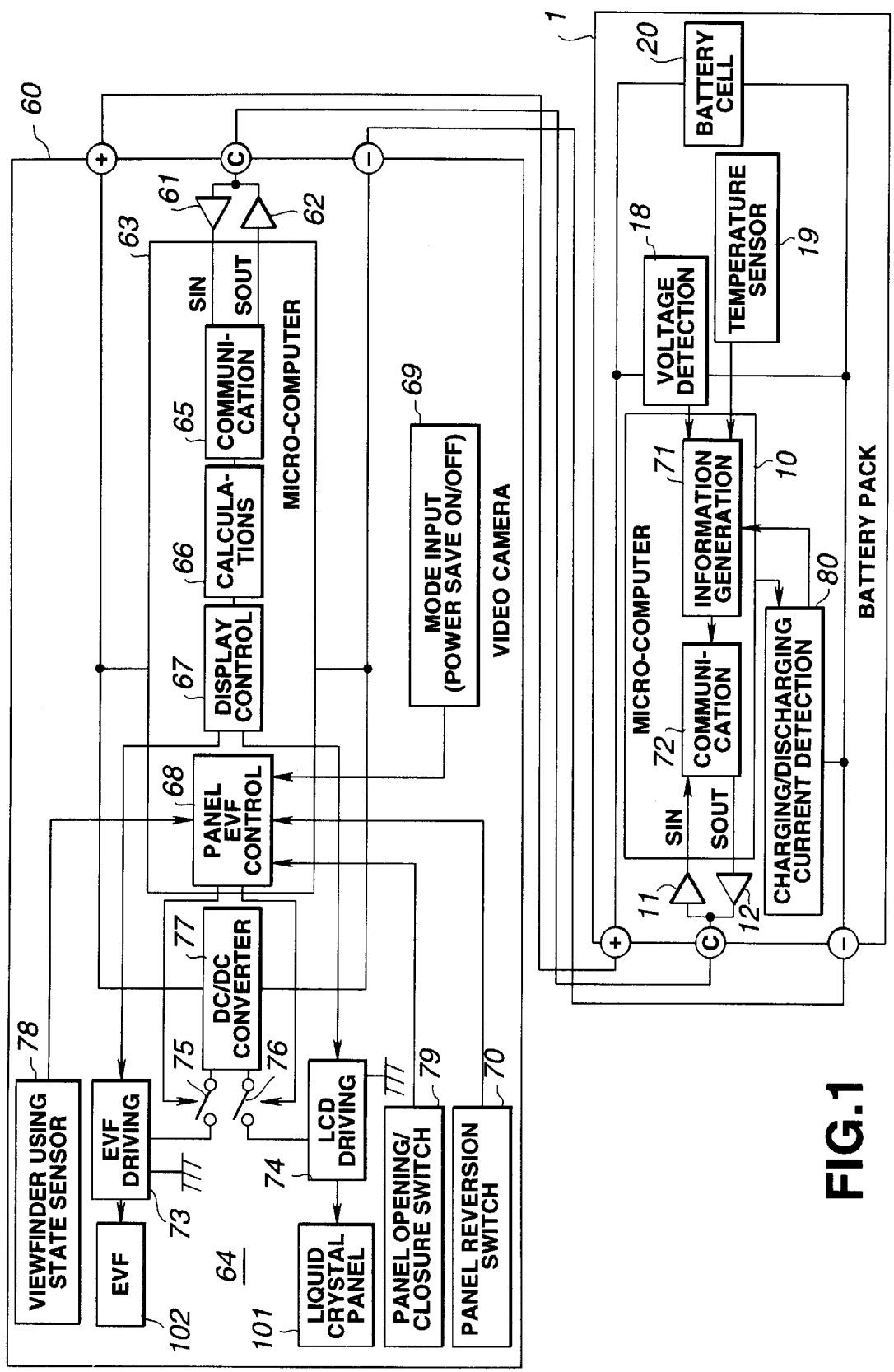
FIG. 1 is a block circuit diagram showing an illustrative structure of an electronic equipment having the function of displaying the battery residual quantity and a system for implementing the method for displaying the battery residual quantity according to the present invention.

Referring to the drawings, preferred embodiments of the present invention will be explained in detail.

FIG. 1 shows an illustrative structure of a system made up of a battery pack 1 of the present invention and a video tape recorder with a built-in camera, referred to hereinafter in their entirety as a video camera 60, as an example of an electronic equipment adapted for carrying the battery pack 1 and having the function of displaying the residual battery capacity.

Referring to FIG. 1, the video camera 60 has loaded thereon the battery pack 1 at least outputting the information on the residual battery capacity, the charging/discharging current detection information and the battery cell voltage detection information, and includes a computer 63 having a communication circuit 65, a calculation circuit 66 and a display control circuit 67, and a display device 64 supplied with the result of calculations of the calculation circuit 66 for displaying the residual battery quantity from the displayed signal. The communication circuit 65 is adapted for receiving the information of various sorts from the battery pack 1, while the calculation circuit 66 calculates the current residual battery capacity based on the various sorts of the information from the battery pack 1 received by the communication circuit 65. The display control circuit 67 generates the display signals based on the results of calculations by the calculation circuit 66. Meanwhile, the video camera 60 has various sorts of arrangements for imaging and for recording/reproducing imaged video signals. However, in the illustration of FIG. 1, only the micro-computer 63 and the display device 64, as main components of the present invention, are shown.

The battery pack 1 includes at least the above-mentioned micro-computer 10, a battery cell 20, a charging/discharging current detection circuit 80 for detecting the charging/discharging current, a voltage detection circuit 18 for detecting the voltage across the terminals of the battery cell 20 and a temperature sensor 19 for detecting the temperature of the battery cell 20. In the micro-computer 10 are enclosed a communication circuit 72 for having communication with the video camera 60 and an information generating circuit 71 for generating the information specifying the state of the battery pack 1. The information generating circuit 71 illustrated generates, as the information specifying the state of the battery pack 1, the temperature detection information along with the information specifying the residual battery capacity, charging/discharging current detection information and the battery cell detection information. The information from the information generating circuit 71, such as that specifying the residual battery capacity, is sent via the communication circuit 72 to the video camera 60. The detailed structure of the battery pack 1 will be explained subsequently.

The battery pack 1 has its positive terminal connected to the positive terminal of the video camera 60, while having its negative terminal connected to the negative terminal of the video camera 60. The power is supplied via these positive and negative terminals to the video camera 60 from the battery pack 1. The communication of the information between the battery pack 1 and the video camera 60 is via a control terminal C. The communication between the micro-computer 10 of the battery pack 1 and the vide camera 60 via control terminal C occurs via buffer amplifiers 11, 12 and via buffer amplifiers 61, 62 on the side of the battery pack 1 and on the side of the video camera 60, respectively.

The video camera 60 receives the information showing the status of the battery pack 1, sent via the control terminal from the battery pack 1, and seizes the received information in the micro-computer 63. The information showing the status of the battery pack is the information specifying the status of the battery pack 1.

The information received via the communication circuit 65 of the micro-computer 63 is sent to the calculation circuit 66 where various calculations are executed for finding the residual usable time of the video camera 60, in other words, the usable residual service life of the battery, from the received information, such as the information specifying the residual battery capacity. The residual usable time of the video camera 60 may be exemplified by the residual recording time of recording imaged picture signals on a recording medium, such as a magnetic tape, and the residual playback time in reproducing the imaged picture signals, that is the possible operating time of the video camera 60.

The display control circuit 67 generates, based on the residual usable time of the battery as found by the calculation circuit 66, the residual battery service time display signal for display on so-called on-screen display (OSD) or on display means of the display device 64 of the main body portion of the video camera 60.

Figure 2:
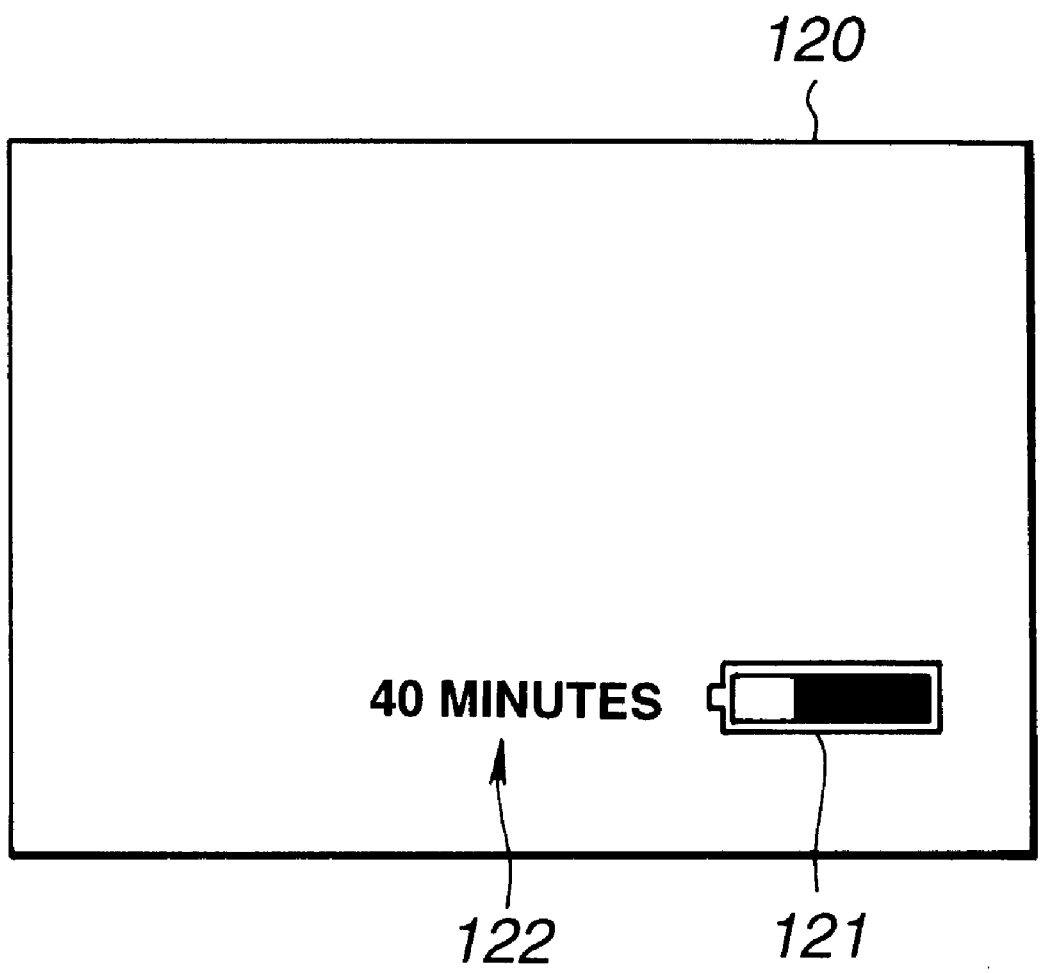
FIG. 2 illustrates an example of the residual service life of the battery as displayed on a display screen.

The display device 64 has, as the above-mentioned display means, a viewfinder (EVF) 102 and a liquid crystal panel 101, and displays the information derived from the residual battery time display signal supplied to the display screen of these display means from the display control circuit 67. FIG. 2 shows an illustrative example of the residual battery time displayed on the display means. Specifically, FIG. 2 shows a display example comprised of a digital time display 122 specifying the residual battery time and a level display 121 for intuitive visual indication of the ratio in percentage of the current residual battery time to the fully charged state of the battery, with the display 122 and the display 121 being on a display screen 120 of the display means. The digital time display 122 specifies the residual battery time by numerical indication which herein is 40 minutes. The level display 121 may be designed for displaying the level in four or more steps or steplessly for specifying the residual battery time. The detailed structure and operation of the display device 64 will be explained subsequently.

Thus it is possible with the system of the instant embodiment to apprize the user of the video camera 60 of the residual usable battery time, that is the possible operating time of the video camera 60, by displaying the residual battery time on the display screen of the display device 64 of the video camera 60. Also, in the instant embodiment, the residual battery capacity display technique by the level display 121 is used for enabling intuitive and readily comprehensible display, while the residual battery capacity display technique by the time display 122 in minutes is used for improving accuracy in the residual battery quantity display. This enables the user of the video camera 60 to supervise the imaging time or playback time easily.

In the present system, the above-mentioned residual battery time is calculated based on the battery properties as now explained.

Figure 3:
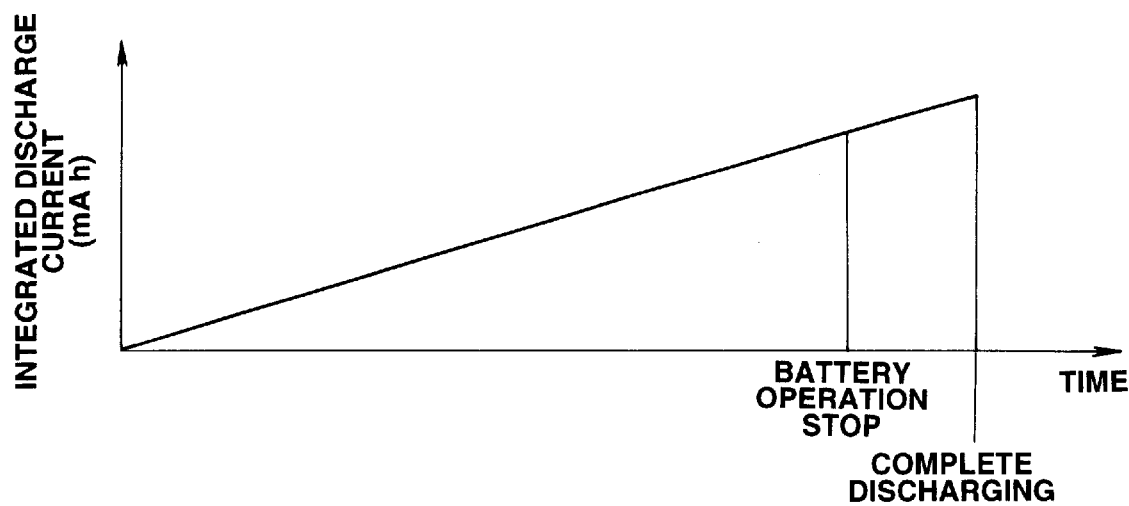
FIG. 3 is a graph showing the relation between the amount of the integrated discharge current of the battery and time.

If the battery is discharged at a constant power consumption, the integrated value of the discharge current is roughly proportionate to time, as shown in the graph of FIG. 3. If the minimum usable voltage of the video camera 60 (terminal battery voltage or battery termination voltage) is fixed, the point of terminal battery voltage is positioned between start of discharge and complete discharge, that is absence of energy in the battery cell 20.

Figure 4:
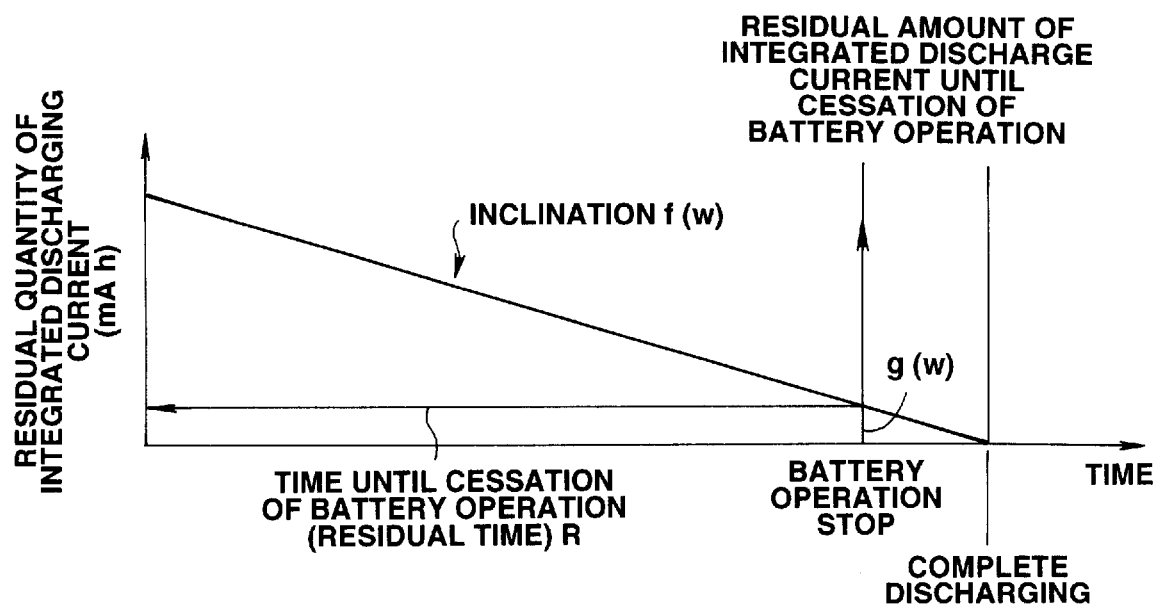
FIG. 4 is a graph showing the relation between the residual amount of the integrated discharge current of the battery and time.

The relation to the discharge time of the residual amount of the integrated discharge current until complete discharge is as shown in FIG. 4. If, in the graph of FIG. 4, the battery terminal point is taken as an origin and a coordinate system is set, the ordinate represents the residual amount of the integrated discharge current up to the battery termination and the abscissa represents the residual time up to the battery termination. Thus, if the residual amount of the integrated discharge current up to battery termination is known, it becomes possible to uniquely find the residual battery time.

Figure 5:
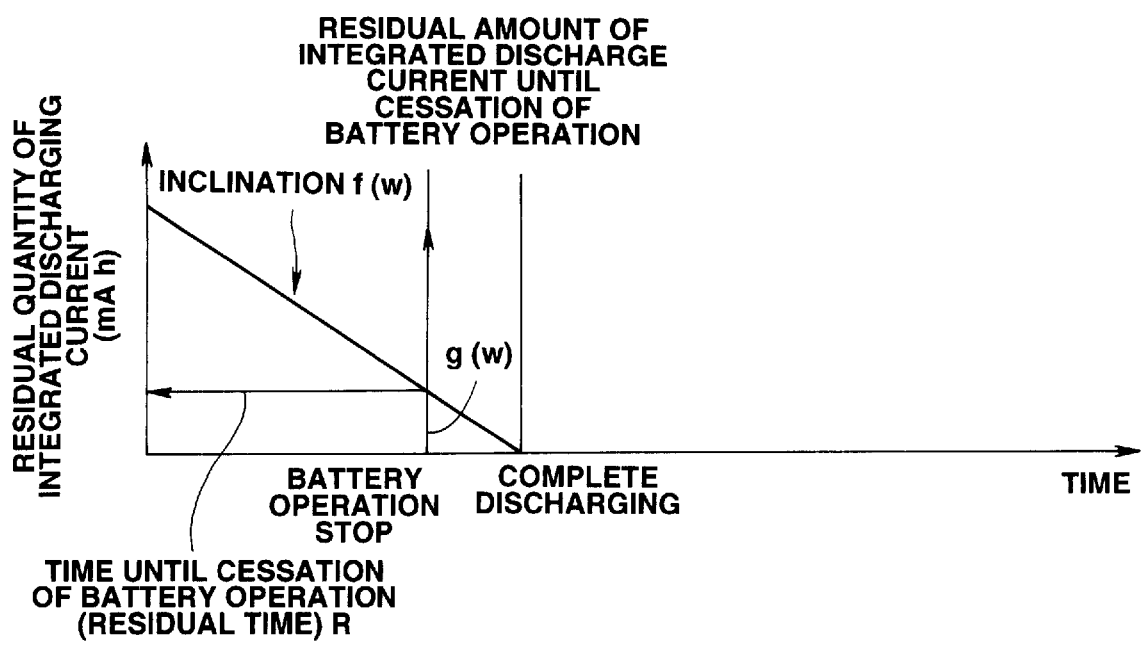
FIG. 5 is a graph showing the relation between the residual amount of the integrated discharge current of the battery for high power consumption and time.

If the power consumption of the video camera 60 is high, the discharge current becomes high. In this case, the discharge characteristics are as shown in FIG. 5. From the graph of FIG. 5, it is seen that the rate of the residual time to the residual amount of the integrated discharge current becomes smaller than if the power consumption is low as in FIG. 4. The residual amount of the integrated discharge current since battery termination until complete discharge is changed with the effect of internal impedance of the battery cell 20 if the power consumption is high.

This can be mathematically expressed by the following equation (1):

$$R = Qdf(W)$$
$$= (Q - g(W))f(W) \quad (1)$$

where R, Qd, W, f(W), Q and g(W) denote time until battery termination (residual time), an integrated discharge current up to battery termination, power consumption of the video camera 60, a power-dependent coefficient and a power-dependent residual amount of the integrated discharge current on battery termination.

In the equation (1), f(W) is a power-dependent coefficient for converting the residual amount of the integrated discharge current into residual time, while g(W) is the power-dependent residual amount of the integrated discharge current as from battery termination up to complete discharge.

If account is taken of temperature changes of the battery cell 20, the equation (1) becomes an equation (2):

$$R = Qdf(W)h1(T)$$
$$= (Q - g(W)h2(T))f(w)h1(T) \quad (2)$$

where T denotes the battery cell temperature, while h1(T) and h2(T) denote the temperature-dependent coefficients of the battery cell. It is noted that Q, h1(T) and h2(T) are proper to the battery pack 1, while f(W) and g(W) are proper to the video camera 60.

It is seen from the equation (2) that the equation (2) is obtained by multiplying f(W) and h(W) in the equation (1) with the temperature-dependent coefficients h1(T) and h2(T), respectively.

The temperature-dependent coefficients h1(T) and h2(T) assume different values depending on the sorts of the battery cell. Thus it becomes possible to absorb the difference in the equation ascribable to the difference in the battery cell.

In addition, in the above equations (1) and (2), the power consumption (W) differs with different using states of the video camera 60. For example, the time R1 until battery termination for the power consumption W1 and the time R2 until battery termination for the power consumption W2, where W2≠W1, are represented by the equations (3) to (6):

$$R1 = (Q - g(W1))f(W1) \quad (3)$$
$$R2 = (Q - g(W2))f(W2) \quad (4)$$
$$R1 = (Q - g(W1))h2(T)) f(W1)h1(T) \quad (5)$$
$$R2 = (Q - g(W2) h2(T)) f(W2) h1(T) \quad (6)$$

where the equations (3) and (4) correspond to the equation (1) and the equations (5) and (6) correspond to the equation (2).

As may be seen from the above equations (3) to (6), the residual battery quantity is calculated in the present system responsive to the changes in the power consumption, so that, even if the power consumption W of the video camera 60 is changed, it becomes possible to display the residual battery time corresponding to the changes in the using state of the video camera 60.

In other words, in the present system, the residual battery time is calculated using only the power consumption, without regard to the sort (contents) of the using states of the video camera 60, while no particular parameter specifying the using state of the video camera 60 is required for calculating the residual battery time. This indicates that the above-described method for calculating the residual battery time represents a method of high universality independent of the sort of the video camera 60. An illustrative example in which the power consumption is changed with the using state of the video camera 60 will be explained subsequently.

Figure 6:
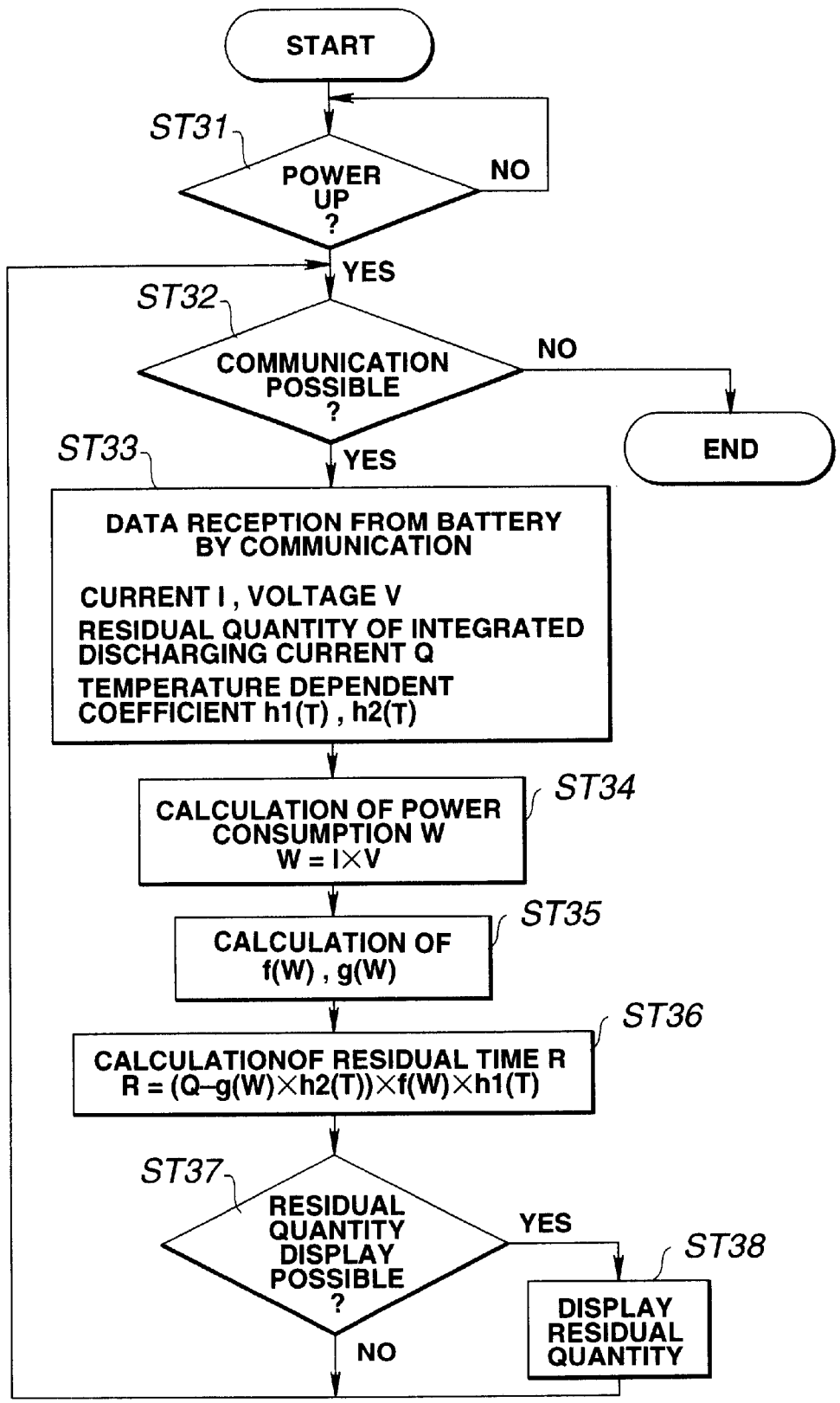
FIG. 6 is a flowchart showing the algorithm of calculation of the residual capacity.

The sequence of operations for receiving data and calculating the residual quantity in case the micro-computer 60 calculates the residual battery time based on the information from the battery pack 1, such as the information on the residual battery capacity, is now explained using a flowchart of FIG. 6.

At step ST31 in FIG. 6, it is checked whether or not the power source has been turned on. If the power source is not turned on, the check of step ST31 is repeated. If the power source has been turned off, processing transfers to step ST32.

At step ST32, it is checked whether or not communication can be had with the battery pack 1. If the result of check is NO, processing is terminated. If the result of check is YES, processing transfers to step ST33.

At step ST33, the current I, voltage V, residual amount of integrated discharge current Q, and the temperature-dependent coefficients h1(T), h2(T), as data required for calculating the residual quantity, are received from the battery pack 1.

At the next step ST34, the power consumption W is calculated. At step ST35, f(W) and g(W) are calculated. At step ST36, the residual time until battery termination R is calculated, using the equations (2), (5) and (6) or using the equations (1), (3) and (4) if temperature changes are not taken into account.

Then, at step ST36, it is checked whether or not the residual quantity can be displayed. If the residual quantity cannot be displayed, processing reverts to step ST32 and, if the residual quantity can be displayed, the residual quantity (residual battery time) is displayed at step ST38 on the display device 64. The residual quantity displayed may be the usable time of the battery pack 1 (usable time for the video camera 60) or the residual capacity of the battery pack 1, such as the residual capacity up to the above-described battery terminal point.

With the above-described system, shown in FIG. 1, in which a coefficient for compensating the difference in discharge characteristics by the battery cell 20 of the battery pack 1 is used for calculating the residual quantity, the algorithm for calculating the residual amount is independent of the battery cell to enable the algorithm to be unified. Since the residual battery capacity is displayed in unit of time, it becomes possible for the user to supervise the imaging time. By displaying the residual battery time not only by the four-level display 121, but also by the minute-based time display 122, the residual battery quantity can be displayed with improved accuracy.

Figure 7:
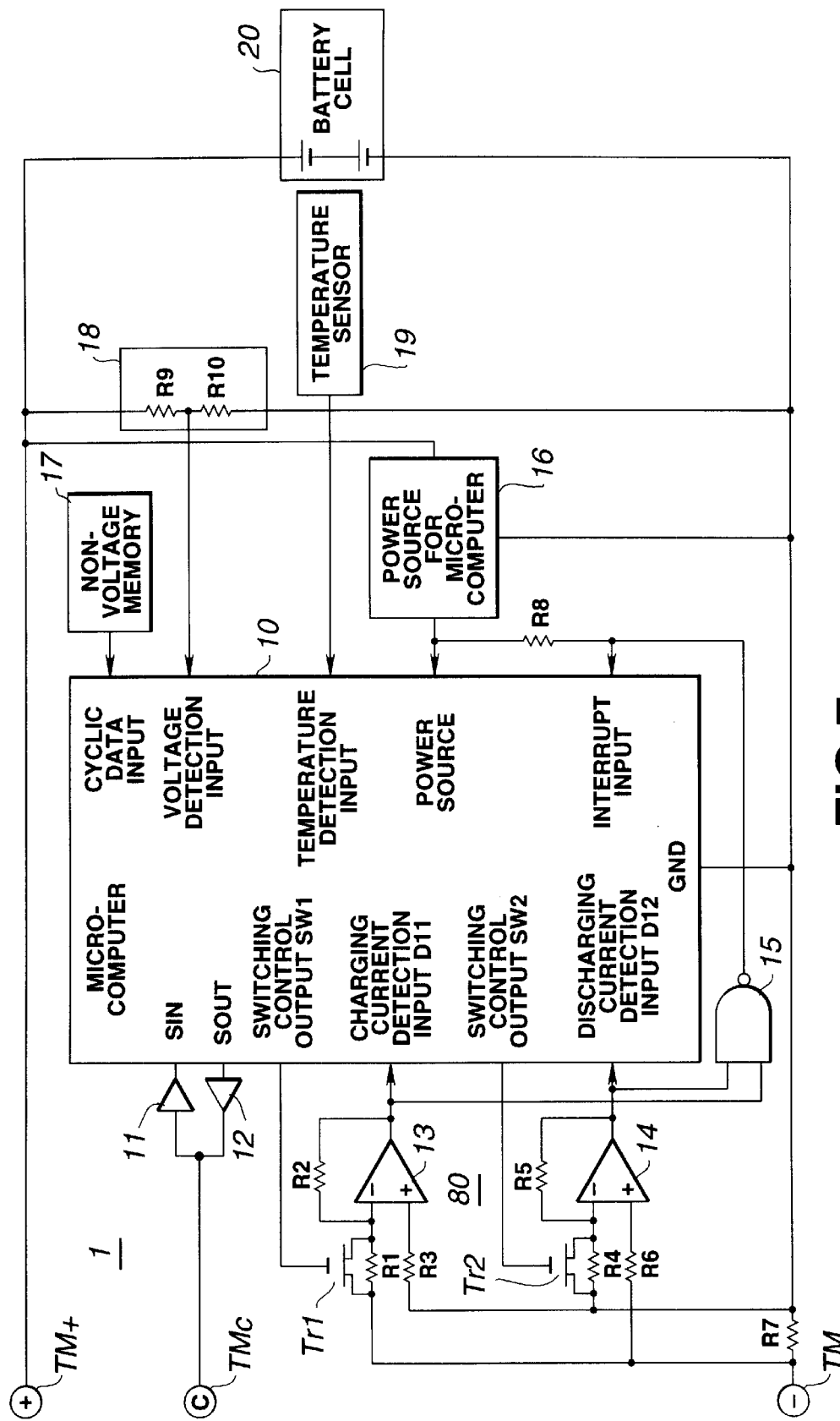
FIG. 7 is a circuit diagram showing an illustrative structure of a battery pack.

FIG. 7 shows an illustrative structure of the battery pack 1.

In this figure, the battery cell 20 has its positive terminal connected to the positive terminal TM+ of the battery pack 1, while having its negative electrode connected via a current detection resistor R7 to the negative terminal TM− of the battery pack 1.

The micro-computer 10 enclosed in the battery pack 1 is fed with the current from a micro-computer power source 16, inclusive of a serial regulator or a resetting circuit, so as to be operated by the current supplied from the micro-computer power source 16. The micro-computer 10 has its charging current detection input terminal D11 connected to an output terminal of an operational amplifier 13 provided for detecting the charging current, while having its discharging current detection input terminal D12 connected to an output terminal of the operational amplifier 14 provided for detecting the discharging current. The micro-computer 10 has its interrupt input terminal connected to an output terminal of a two-input AND gate 15, two input terminals of which are connected to output terminals of the operational amplifiers 13 and 14. The two-input AND gate 15 has its output terminal connected via a pull-up resistor R8 to a power source terminal. The micro-computer 10 has its temperature detection input terminal connected to an output terminal of a temperature sensor 19 detecting the ambient temperature of the battery cell 20, while having its voltage detection input terminal connected to an output terminal of a voltage detection circuit 18 configured for detecting the terminal voltage of the battery cell 20. The micro-computer 10 also has its cycle data input terminal connected to an output terminal of a non-volatile memory 17 as later explained, while having its grounding terminal to a negative electrode of the battery cell 20. In addition, the micro-computer 10 has its input terminal or SIN terminal and output terminal or SOUT terminal for having communication with the video camera 60 connected to buffer amplifiers 11, 12, respectively. Meanwhile, since the terminals fed with analog inputs, such as the above-mentioned charging current detection input terminal D11, discharging current detection input terminal D12, temperature detection input terminal or the voltage detection input terminal, are all A/D input ports, there is enclosed in the micro-computer 10 an A/D converter for converting the analog inputs to digital signals.

The voltage detection circuit 18 is a voltage-dividing resistor circuit made up of resistors R9 and R10 for detecting the voltage across the terminals of the battery cell 20. The detected voltage value from the voltage detection circuit 18 is supplied to the voltage detection input terminal of the micro-computer 10. Thus the voltage across the terminals of the battery cell 20 can be known by the micro-computer 10 based on the detected voltage value from the voltage detection circuit 18 supplied to its voltage detection input terminal.

The temperature sensor 19 is comprised of, for example, a temperature detecting thermistor and arranged in proximity to or in contact with the battery cell 20. The detected temperature of the temperature sensor 19 is supplied to the temperature detection input terminal of the micro-computer 10. Thus the micro-computer 10 can grasp the temperature of the detected temperature supplied to the temperature detection input terminal.

The operational amplifier 13 has its non-inverting input terminal connected via a resistor R3 and a current/voltage detection resistor R7 to the negative electrode of the battery cell 20, while having its inverting input terminal connected to a feedback resistor R2 for amplification factor setting and to a resistor R1. Thus an output terminal of the operational amplifier 13 outputs an amplified voltage value obtained on amplifying the current flowing in the battery pack 1 (current flowing during charging) depending on the resistance ratio of the resistors R1 and R2 (R2/R1). On the other hand, the operational amplifier 14 has its non-inverting input terminal connected to the negative electrode of the battery cell 20 via a resistor R6 and a current/voltage detecting resistor R7, while having its inverting input terminal connected to a negative feedback resistor R5 and to a resistor R4. Thus an output of the operational amplifier 14 outputs an amplified voltage value obtained on amplifying the current flowing in the battery pack 1 (current flowing during discharging) depending on the resistance ratio of the resistors R4 and R5 (R5/R4).

A transistor switch Tr1 is, for example, a field-effect transistor having its gate connected to a switching control output terminal SW1 of the micro-computer 10. The above-mentioned resistor R1 is connected between the drain and the source of the transistor switch Tr1. Thus, when the signal level from a switching control output terminal SW1 of the micro-computer 10 goes high, the transistor switch Tr1 is turned on, so that the resistance by the resistor R1 becomes substantially zero, that is, the resistance is made up only of the internal resistance of the transistor switch Tr1. This increases the amplification factor (gain) of the operational amplifier 13 which is set responsive to the resistance ratio of the resistors R1 and R2 (R2/R1). On the other hand, if the signal level of the signal from the switching control output terminal SW1 of the micro-computer 10 goes low, the transistor switch Tr1 is turned off, so that the amplification factor of the operational amplifier 13 is of a value in meeting with the resistance ratio of the resistors R1 and R2 (R2/R1), that is, it becomes lower than the amplification factor when the transistor switch Tr1 is turned on. Similarly, a transistor switch Tr2 is, for example, a field-effect transistor having its gate connected to a switching control output terminal SW2 of the micro-computer 10. The above-mentioned resistor R4 is connected between the drain and the source of the transistor switch Tr2. Thus, when the signal level from a switching control output terminal SW2 of the micro-computer 10 goes high, the transistor switch Tr2 is turned on, so that the resistance by the resistor R4 becomes substantially zero, that is, the resistance is made up only of the internal resistance of the transistor switch Tr2. This increases the amplification factor (gain) of the operational amplifier 14. On the other hand, if the signal level of the signal from the switching control output terminal SW2 of the micro-computer 10 goes low, the transistor switch Tr1 is turned off, so that the amplification factor of the operational amplifier 13 becomes small.

During normal operational mode, that is during running, the micro-computer 10 perpetually monitors the level of the charging current detection input terminal D11 and the discharging current detection input terminal D12. If the levels of the terminals D11 and D12 become higher than a pre-set level, the micro-computer 10 sets the signals of the switching control output terminals SW1 and SW2 to a low level. This turns both the transistor switches Tr1 and Tr2 off to lower the amplification gain of the operational amplifiers 13 and 14. Thus, during the normal operational mode, that is during running, the micro-computer 10 can measure the current flowing in the battery pack 1, that is the current flowing during charging (or the current flowing during discharging) using the output values of the operational amplifiers 13 and 14 having the amplification gains reduced as described above. Thus, if the current flowing during charging/discharging is known, the integrated value of the charging/discharging current can be calculated.

On the other hand, if, during the above normal operational mode (during running) of the micro-computer 10, the charging/discharging current flowing through the battery pack 1 becomes smaller than the above-mentioned pre-set value, the output values of the operational amplifiers 13, 14, whose amplification gains have been reduced, are also reduced. That is, the signal levels of the signals from the charging current detection input terminal D11 and the discharging current detection input terminal D12 are also reduced. If the signal levels of the signals of the terminals D11 and D12 of the micro-computer 10 become lower than a pre-set level and this state persists for a pre-set time, the micro-computer 10 deems that the unloaded state persists and transfers to a power saving mode (sleep mode). During this sleep mode, the power consumption becomes smaller than during the normal operational mode, thus enabling energy saving.

During this power saving mode (sleep mode), the micro-computer 10 sets the signal levels of the signals from the switching control output terminals SW1 and SW2 to a high level. This turns the transistors Tr1, Tr2 on for increasing the amplification gains of the operational amplifiers 13, 14. Thus, during the power saving mode (sleep mode), the micro-computer 10 can measure the small current flowing in the battery pack 1 (small current flowing during charging or during discharging) using the output values of the operational amplifiers 13, 14 having the increased amplification gains.

If, during the power saving mode, the charging/discharging current value exceeds the above-mentioned pre-set value, the output values of the operational amplifiers 13, 14 with the decreased amplification gains are also increased. That is, the level of the two input terminals of the two-input NAND gate 15 goes high so that the output level of the two-input NAND gate 15 goes low. That is, if the output level of the two-input NAND gate 15, supplied to the interrupt input terminal, goes low, the micro-computer 10 releases the power saving mode to transfer to the normal operating mode.

With the arrangement of FIG. 7, as described above, the power consumption is smaller during the power saving mode than during the normal operational mode, thus enabling energy saving. In addition, in the arrangement of FIG. 7, the micro-computer 10 on/off controls the transistors Tr1 and Tr2 by the switching control outputs SW1 and SW2 for enabling the switching of the amplification gains of the operational amplifiers 13, 14, such that detection of the small current during power saving mode and measurement of the current value during the normal operational mode can be realized simultaneously by the present arrangement.

The non-volatile memory 17 is comprised of, for example, an EEP-ROM for storing data of the maximum number of the charging/discharging cycles of the battery cell 20. The micro-computer 10 measures the number of the charging/discharging cycles of the battery cell 20 on the basis of data on the maximum number of times of charging/discharging cycles from the non-volatile memory 17 (cycle data) and a detection voltage from the voltage detection circuit 18. When the number of the charging/discharging cycles of the battery cell 20 has reached the above-mentioned maximum number of times of the charging/discharging cycles, a flag notifying such effect is transmitted to the video camera 60.

On reception of the flag transmitted from the battery pack 1, the video camera 60 makes a display prompting the user to exchange the battery pack 1 on the display device 64. An example of this display is "This battery is used up so exchange it with a new one". This can easily inform the user of the used-up state of the battery pack 1.

Figure 8:
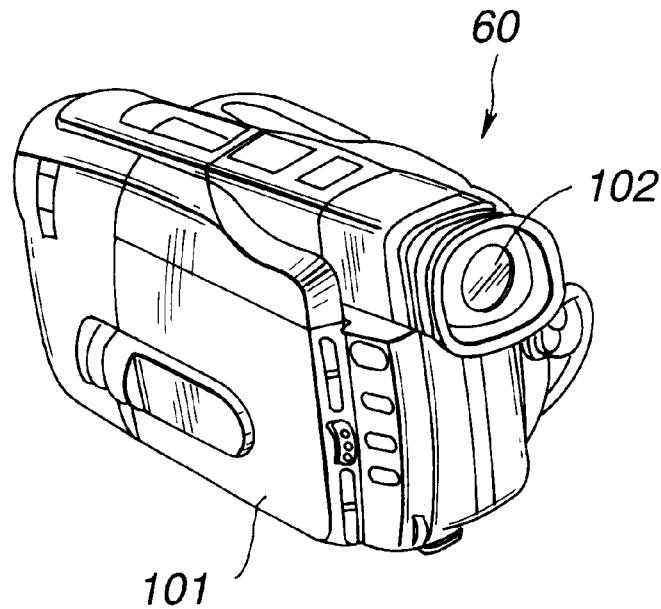
FIG. 8 is a perspective view showing a video camera with a liquid crystal panel in the closed state.
Figure 9:
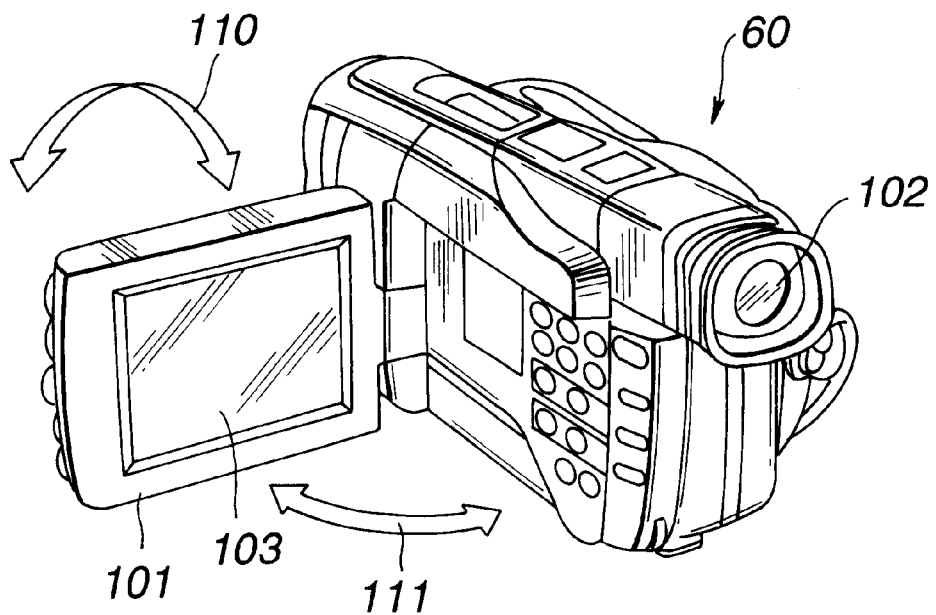
FIG. 9 is a perspective view showing the video camera with the liquid crystal panel in the opened state.
Figure 10:
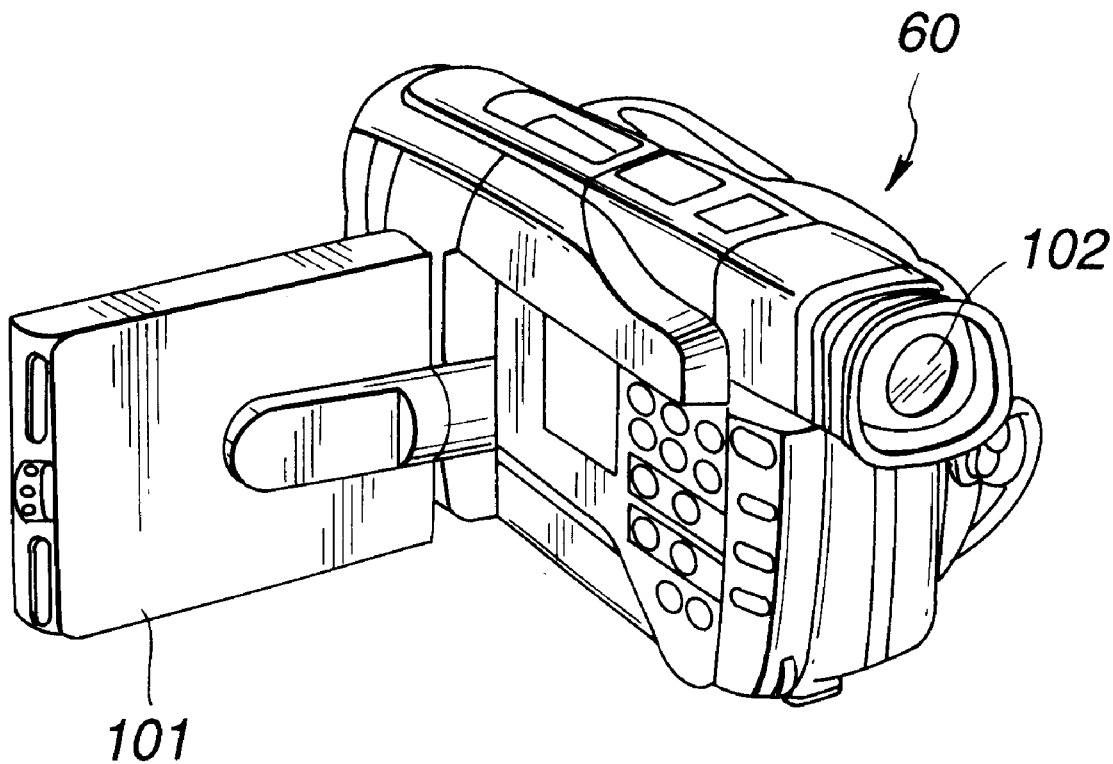
FIG. 10 is a perspective view of a video camera with the liquid crystal display panel in the inverted position.

The power consumption is changed with the using state of the video camera 60 under the following illustrative conditions:

The video camera 60 of the instant embodiment includes, as the display device 64, a viewfinder 102 comprised of a small-sized CRT, and a liquid crystal panel (liquid crystal display) 101, as shown in FIGS. 8 to 10. The viewfinder 102 is similar to one provided on a usual video camera and displays an scene being imaged or an image being reproduced from the video tape. The liquid crystal panel 101 is provided for the purpose of displaying the scene being imaged or reproduced, basically in the same way as the viewfinder 102

The liquid crystal 101 provided in the video camera 60 of the instant embodiment can assume the state in which the liquid display panel is housed within the main body portion of the video camera 60, as shown in FIG. 8. a state in which the liquid display panel can be opened up to 90° towards front in a direction indicated by arrow 111, as shown in FIG. 9 and a state in which the liquid display panel can be swung in a direction shown by arrow 110 up to 210° as shown in FIG. 9. The state in which the liquid display panel is rotated by 180° towards the front side from the opened state shown in FIG. 9 is shown in FIG. 10. The rotation of the liquid crystal panel 101 to the state shown in FIG. 10 is hereinafter referred to as the panel inversion. The state in which the liquid crystal panel 101 is housed within the main body portion of the video camera 60 as shown in FIG. 8 is termed the closed state, while that in which the liquid crystal panel 101 has been opened in the direction indicated by arrow 111 as shown in FIG. 9 is termed the opened state. With the video camera 60 of the instant embodiment, since the liquid crystal panel 101 can be opened and closed as described above, while it can be rotated towards the front side, the scene being imaged can be seen without viewing through the viewfinder 102. In addition, the video camera 60 can be used in a variety of ways. Since the specified structure of the opening/closing mechanism or the rotating mechanism for the liquid crystal panel 101 is not pertinent to the present invention, detailed description therefor is not made for simplicity.

The video camera 60 of the instant embodiment has the viewfinder 102 and the liquid crystal panel 101 as the display device 64, as described above. Depending on the using state of the video camera 60, both the viewfinder 102 and the liquid crystal panel 101 may be used simultaneously, only one of the viewfinder 102 and the liquid crystal panel 101 may be used, or none of the viewfinder 102 and the liquid crystal panel 101 may be used. That is, since viewfinder 102 and the liquid crystal panel 101 may or may not be used depending on the using state, the power consumption is changed.

With the system of the instant embodiment, since the residual battery quantity is calculated depending on changes in the power consumption, as described above, even although the power consumption is changed depending on the using state of the video camera 60, it becomes possible to display the residual battery service life in meeting with changed using states of the video camera 60.

FIG. 11 shows various patterns of using states of the viewfinder 102 and the liquid crystal panel 101 in the video camera 60 of the instant embodiment. That is, the video camera 60 of the instant embodiment has a power save mode for saving the power consumption and, by turning the power save mode on or off, the use/non-use (on/off) of the viewfinder 102 and the liquid crystal panel 101 is controlled as shown in FIG. 11.

If, in this figure, the power save mode is off, and the liquid crystal panel 101 is opened, the viewfinder (EVF) 102 is turned off with the liquid crystal panel being on. If the liquid crystal panel is in the closed state, the viewfinder 102 is turned on, with the liquid crystal panel being off. In the inverted state of the liquid crystal panel 101 in which the liquid crystal panel 101 has been rotated, both the liquid crystal panel 101 and the viewfinder 102 are turned on. That is, if the power save mode is off, and the liquid crystal panel 101 is opened, only the liquid crystal panel 101 is turned on, on the assumption that the viewfinder 102 is not used by the user of the video camera 60. On the other hand, if the panel is closed, the user cannot view the liquid crystal panel, so that only the viewfinder 102 is turned on. In the inverted stated of the liquid crystal panel 101, both the liquid crystal panel 101 and the viewfinder 102 are turned on, on the assumption that there is another person viewing the liquid crystal panel 101 besides the user viewing the viewfinder 102.

If, in FIG. 11, the power save mode is on, and the liquid crystal panel 101 is opened, the viewfinder (EVF) 102 is turned off with the liquid crystal panel 101 being on. If, in the closed state of the panel, the user is viewing through the viewfinder 102, the liquid crystal panel 101 is turned off, while the viewfinder 102 is turned on. If, in the closed state of the panel, the user is not viewing through the viewfinder 102, both the liquid crystal panel 101 and the viewfinder 102 are turned off. If, in the inverted state of the panel, the user is viewing through the viewfinder 102, both the liquid crystal panel 101 and the viewfinder 102 are turned on. On the other hand, if the liquid crystal panel is in the inverted state and the user is not viewing through the viewfinder 102, only the liquid crystal panel 101 is turned on. That is, if the power save mode is on, and the panel is in the opened state, it is assumed that the viewfinder 102 is not used by the user of the video camera 60, so that only the liquid crystal panel 101 is opened for power saving. If the panel is in the closed state and the user is viewing through the viewfinder 102, the user cannot view the liquid crystal panel 101, so that only the viewfinder 102 is turned on. . If the panel is in the closed state and the user is not viewing through the viewfinder 102, it is assumed that the user cannot view the liquid crystal panel 101, while the user is not viewing through viewfinder 102, so that both the panel and the viewfinder are turned off. If the panel is in the inverted state and the user is viewing through the viewfinder, it is assumed that there is another person is viewing the liquid crystal panel 101 besides the user viewing through the viewfinder 102, so that both the panel and the viewfinder are turned on. If the panel is in the inverted state and the user is not viewing through the viewfinder, it is assumed that the user is not viewing through the viewfinder 102 but is viewing only the liquid crystal panel 101, so that only the liquid crystal panel 101 is turned on.

Figure 12:
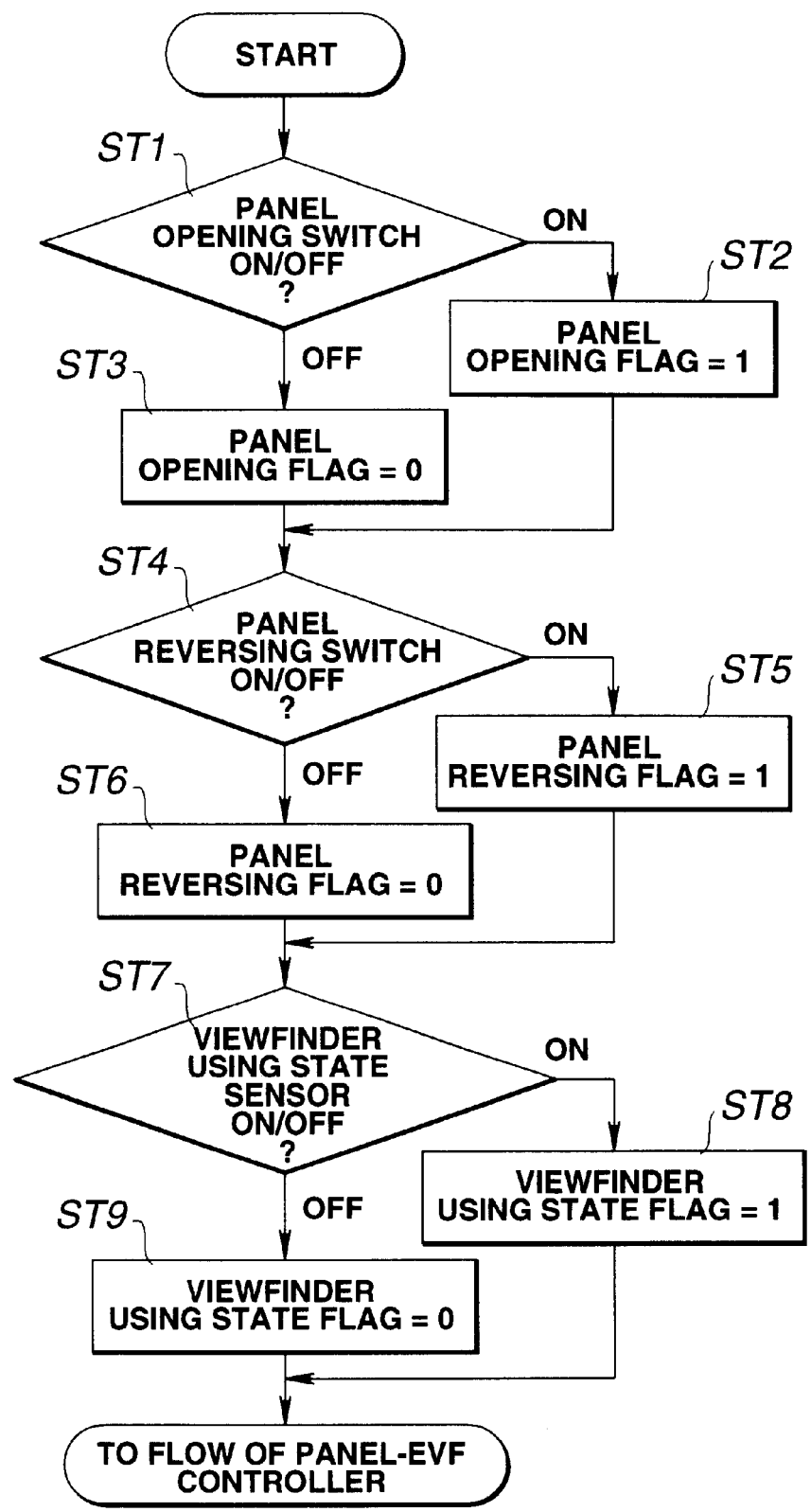
FIG. 12 is a flowchart for generating flags.
Figure 13:
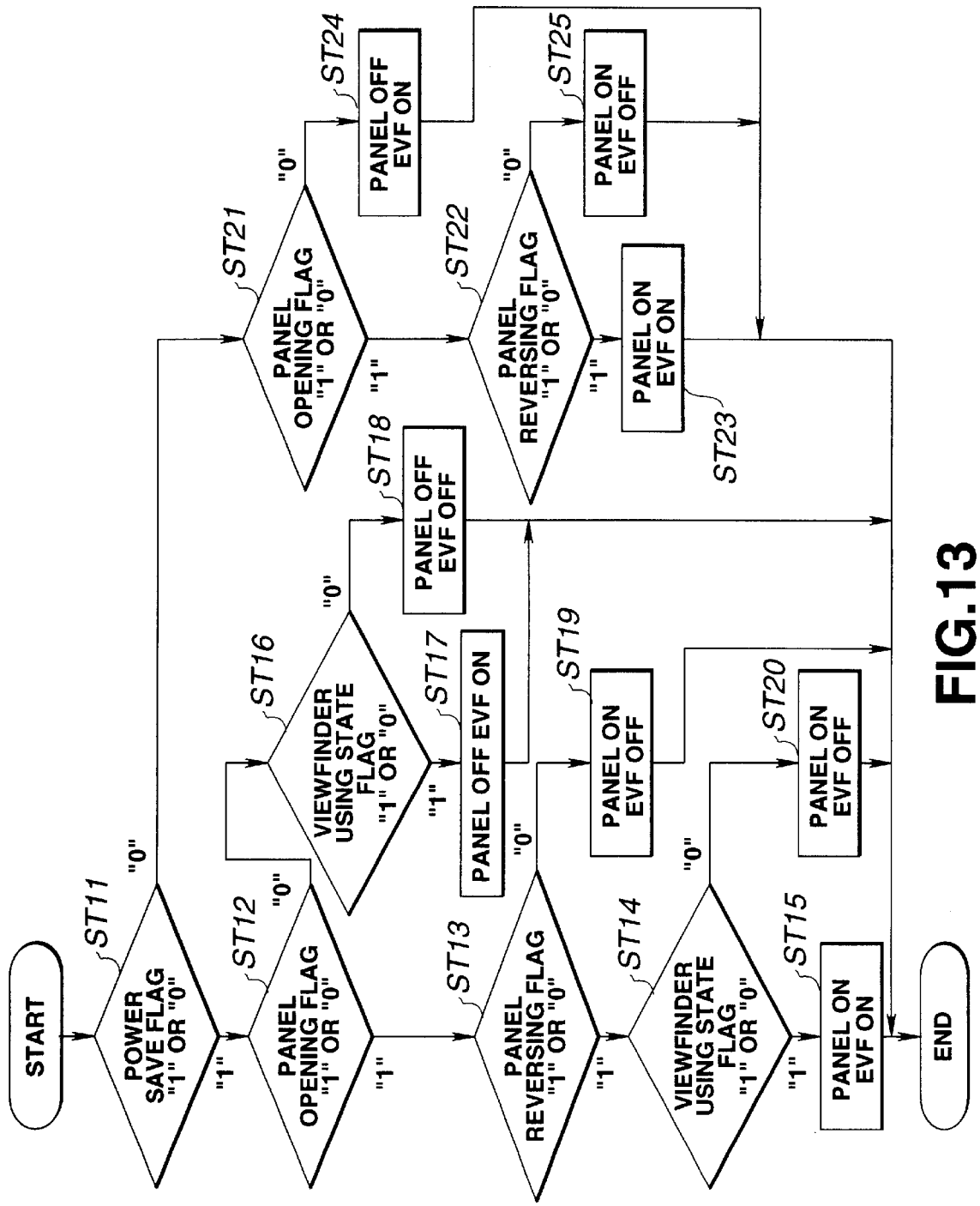
FIG. 13 is a flowchart for performing on/off control of the liquid crystal display panel and the viewfinder.

The display control of the viewfinder 102 and the liquid crystal panel 101 depending on the patterns of the using states of the video camera 60 as described above is carried out in accordance with the flowcharts shown in FIGS. 12 and 13.

It is noted that the video camera 60 of the instant embodiment includes a panel opening/closure switch 79 for detecting whether the liquid crystal panel 101 is in the opened state or in the closed state, a panel inversion switch 70 for detecting whether the liquid crystal panel 101 is in the inverted state, and a viewfinder using state sensor 78 for detecting whether or not the viewfinder 102 is being seen through by the user, as shown in FIG. 1.

Thus, in the flowchart of FIG. 12, it is judged at step ST1 whether the panel opening/closure switch 79 is turned on (in the opened state) or turned off (in the closed state). If it is judged at step ST1 that the panel opening/closure switch 79 is on, processing transfers to step ST2 in which the value of a panel open flag is set to "1" as the information specifying that the panel opening/closure switch 79 is on. If it is judged at step ST1 that the panel opening/closure switch 79 is off, processing transfers to step ST3 in which the value of the panel open flag is set to "0" as the information specifying that the panel opening/closure switch 79 is off.

At the next step ST7, it is checked whether the state of the panel reversion switch 70 is on (in the inverted state) or off (in the non-inverted state). If it is judged at step ST4 that the panel reversion switch 70 is on, processing transfers to step ST5 where the value of the panel inversion flag is set to "1" as the information specifying that the panel reversion switch 70 is on. If it is judged at step ST4 that the panel reversion switch 70 is on, processing transfers to step ST6 where the value of the panel inversion flag is set to "0" as the information specifying that the panel reversion switch 70 is off.

At the next step ST7, it is checked whether the viewfinder using state sensor 78 is on (in the using state) or off (in the non-using state). The viewfinder using state sensor 78 is an infra-red sensor provided within the viewfinder 102 and is turned on and off if the user is viewing through the viewfinder 102 and if the user is not viewing through the viewfinder 102, respectively. If it is judged at step ST7 that the viewfinder using state sensor 78 is on, processing transfers to step ST8 where the value of the viewfinder using state flag set to "1" as the information specifying that the viewfinder using state sensor 78 is on. If it is judged at step ST7 that the viewfinder using state sensor 78 is off, processing transfers to step ST9 where the value of the viewfinder using state flag set to "0" as the information specifying that the is viewfinder using state sensor 78 off.

If the values of the panel opening flag, panel inversion flag and the viewfinder state flag are set as described above, these are sent to the panel-EVF controller 68 provided within the micro-computer 63 of the video camera 60 shown in FIG. 1.

The panel-EVF controller 68 controls various parts, based on the above flags, as shown in the flowchart of FIG. 13.

In the flowchart, shown in FIG. 13, it is first checked at step ST11 whether the power save mode is set to the on-mode or to the off-mode. In the present system, the power save mode is set to the on-mode or to the off-mode by selection from the operating menu items by a mode input unit 69 as soft keys of the video camera 60. In this manner, a flag (power save flag) is set which assumes the value of "1" or the value of "0" if the power save mode is on or off, respectively. Thus, at step ST11, it is checked whether the value of the power save flag is "1" or "0". If, at step ST11, the value of the power save flag is found to be "1", processing transfers to step ST12 and, if otherwise, processing transfers to step ST21.

At the step ST21, to which processing transfers when the power save flag is "0", that is when the power save mode is off, it is checked whether the value of the panel opening flag is "1" or "0". If it is found at step ST21 that the value of the panel opening flag is "0", processing transfers to step ST24, where the liquid crystal panel 102 is turned off, while the viewfinder (EVF) 101 is turned on, as shown in FIG. 11. If it is found at step ST21 that the value of the panel opening flag is "1", processing transfers to step ST22.

At step ST22, it is checked whether the value of the panel inversion flag is "1" or "0". If it is found at step ST22 that the value of the panel inversion flag is "0", processing transfers to step ST25 where the liquid crystal panel 102 is turned on, while the viewfinder 101 is turned off, as shown in FIG. 11. If it is found at step ST22 that the value of the panel inversion flag is "1", processing transfers to step ST23 where both the liquid crystal panel 102 and the viewfinder 101 are turned on, as shown in FIG. 11.

At the step ST12, to which processing transfers when the power save flag is found to be "1" at step ST11, that is when the power save mode is on, it is checked whether the value of the panel opening flag is "1" or "0". If it is found at step ST12 that the value of the panel opening flag is "0", processing transfers to step ST16 and, if otherwise, to step ST13.

At the step ST16, processing transfers when the value of the panel opening flag is "0", it is checked whether the value of the viewfinder using state flag is "1" or "0". If it is found at step ST16 that the value of the viewfinder using state flag is "0", processing transfers to step ST18 where both the liquid crystal panel 102 and the viewfinder 101 are turned off. If it is found at step ST16 that the value of the viewfinder using state flag is "1", processing transfers to step ST17 where the liquid crystal panel 102 is turned off while the viewfinder 101 is turned on.

At the step ST12 to which processing transfers when the value of the panel opening flag is "1", it is checked whether the value of the panel opening flag is "1" or "0". If it is judged at step ST13 that the value of the panel inversion flag is "0", processing transfers to step ST19 where the liquid crystal panel 102 is turned on while the viewfinder 101 is turned off, as shown in FIG. 11. If it is judged at step ST13 that the value of the panel inversion flag is "1", processing transfers to step ST14.

Art step ST14, it is checked whether the value of the viewfinder state flag is "1" or "0". If it is found at step ST14 that the value of the viewfinder state flag is "0", processing transfers to step ST20 where the liquid crystal panel 102 is turned on while the viewfinder 101 is turned off, as shown in FIG. 11. If it is found at step ST14 that the value of the viewfinder state flag is "1", processing transfers to step ST15 where both the liquid crystal panel 102 and the viewfinder 101 are turned on, as shown in FIG. 11.

The on/off control of the liquid crystal panel 102 and the viewfinder 101 as shown in FIGS. 11 to 13 is implemented by a arrangement as now explained.

Returning to FIG. 1, the video camera 60 includes an EVF driving circuit 73 for driving the viewfinder 102 based on the display signal from the display control circuit 67, an LCD driving circuit 74 for driving the liquid crystal panel 101 based on the display signal from the display control circuit 67 and a DC/DC converter 77 connected to the positive and negative terminals as described above for supplying power to the EVF driving circuit 73 and to the LCD driving circuit 74. The video camera 60 also includes, as a configuration for on/off control of the viewfinder 102 and the liquid crystal panel 101, a changeover switch 75 provided between the DC/DC converter 77 and the EVF driving circuit 73, a changeover switch 76 provided between the DC/DC converter 77 and the LCD driving circuit 74 and the above-mentioned panel-EVF controller 68 configured for performing on/off control of the changeover switches 75, 76 in accordance with FIG. 11 and the flowcharts of FIGS. 12 and 13.

That is, with the video camera 60 of the instant embodiment, the panel-EVF controller 68 performs on/off control of the changeover switches 75, 76 as shown in FIGS. 11 to 13 for realization of the on/off control of the liquid crystal panel 101 and the viewfinder 102.

By performing on/off control of the liquid crystal panel 101 and the viewfinder 102 in this manner, there is produced a change in the power consumption of the video camera 60.

Although the foregoing explanation has been made taking a video camera as an example of the electronic equipment on which is loaded the battery pack, the electronic equipment of the present invention is not limited to the video camera but may also be a portable telephone, personal computer or the like electronic equipment having a display device capable of displaying the residual battery time.

What is claimed is:

1. A residual battery quantity calculation apparatus for calculating a residual battery capacity of a battery pack of a plurality of battery pack types from which is obtained variables including a residual battery capacity which is the remaining capacity of the battery pack, a charging/discharging current which is the present charging and discharging current value to/from the battery pack, a battery cell voltage which is the present voltage of the battery pack, and a value for operational state flags which designate an operational state of a device, said device being powered by said battery pack, said apparatus comprising:

communication means for receiving the variables from the battery pack; and calculation means for calculating the current residual battery quantity every time one of the operational state flags are changed based on the residual battery capacity, the charging/discharging current, the battery cell voltage from said battery pack received by said communication means, and said operational state flags, wherein said calculation means varies at least one variable in dependence on the type of battery pack, and the battery pack includes:

measurement means for measuring one of the variables;

means for adjusting a unit of measurement of the measurement means for measuring the one variable according to a measured level of the one variable; and means for outputting a correction coefficient used for calculating the residual battery quantity wherein said calculation means calculates the residual battery quantity and factors the result by said correction coefficient and wherein said correction coefficient is a temperature dependent coefficient.

2. The residual battery quantity calculation apparatus as claimed in claim 1, wherein the residual battery capacity of said battery pack is related to the integrated discharge current and the residual battery quantity as calculated by the calculation means is the remaining battery time.

3. The residual battery calculation apparatus as claimed in claim 1, further comprising display means for displaying the residual battery quantity calculated by said calculation means.

4. The residual battery quantity calculation apparatus as claimed in claim 3, wherein said display means comprises a liquid crystal panel and a view finder.

5. The residual battery quantity calculation apparatus as claimed in claim 3, wherein said display means is an on-screen display.

6. The residual battery quantity calculation apparatus as claimed in claim 3, wherein said display means displays a numerical figure indicating said remaining battery time.

7. The residual battery quantity calculation apparatus as claimed in claim 3, wherein said display means displays a minute-based numerical figure indicating said remaining battery time.

8. The residual battery quantity calculation apparatus as claimed in claim 1, wherein said calculation means calculates the current residual battery quantity for a plurality of types of battery packs, each battery pack having a different battery terminal voltage to discharging/charging voltage characteristics.

9. The residual battery quantity calculation apparatus as claimed in claim 8, further comprising electronic equipment operated in a plurality of states by said battery pack, each state having a different power consumption; wherein said calculation means calculates the residual battery quantity on the basis of said power consumption without regard to the states of the electronic equipment.

10. The residual battery quantity calculation apparatus as claimed in claim 9, wherein said states of operation of said electronic equipment include a power-save state.

11. The residual battery quantity calculation apparatus as claimed in claim 10, wherein the states of operation of the electronic equipment include activating different types of displays including a liquid crystal panel and a viewfinder.

12. The residual battery quantity calculation apparatus as claimed in claim 10, wherein, in the power-save state, the battery pack discharges a small current; wherein said calculation means calculates the current residual battery quantity based on the small current of the battery pack in the power-save state.

13. The residual battery quantity calculation apparatus as claimed in claim 1, wherein a micro processor generates the information output by the battery pack.

14. The residual battery quantity calculation apparatus as claimed in claim 13, wherein said micro processor continually monitors the charging and discharging of the battery pack to generate the charging/discharging current detection information.

15. The residual battery quantity calculation apparatus as claimed in claim 14, wherein said micro processor controls, in response to a predetermined threshold current, switching the battery pack between charging and discharging.

16. The residual battery quantity calculation apparatus as claimed in claim 15, further comprising:
 a current detection resistor for detecting the current flowing to/from the battery pack; and
 means for generating said predetermined threshold current.

17. The residual battery quantity calculation apparatus as claimed in claim 16, wherein said means for generating the predetermined threshold current is a differential amplifier.

18. The residual battery quantity calculation apparatus as claimed in claim 14, further comprising a voltage detector for detecting said battery cell voltage detection information.

19. The residual battery quantity calculation apparatus as claimed in claim 18, wherein said voltage detector is a voltage detection circuit.

20. The residual battery quantity calculation apparatus as claimed in claim 14, wherein said battery pack has a maximum number of times of charging/discharging cycles; wherein said micro processor measures the current number of said charging/discharging cycles of the battery pack and generates therefrom the residual battery quantity.

21. The residual battery quantity calculation apparatus as claimed in claim 1, wherein said calculation means calculates said residual battery quantity by subtracting from a power-dependent coefficient a power-dependent residual amount of an integrated discharge current of said battery pack and multiplying the result by an integrated discharge current at a battery termination of the battery pack.

22. The residual battery quantity calculation apparatus as claimed in claim 21, wherein said residual battery quantity is calculated by further multiplying the residual battery quantity by a temperature-dependent coefficient of the battery pack thereby taking into account temperature changes of said battery pack.

23. A method for calculating residual battery quantity comprising the steps of:

measuring variables including a residual battery capacity of a battery cell of a plurality of types of battery cells of a battery pack which is the remaining capacity of the battery pack, charging/discharging current which is the present charging and discharging current value to/from the battery pack, the battery cell voltage from the battery pack which is the present voltage of the battery pack, and a value for operational state flags which designate an operational state of a device, said device being powered by said battery pack;

adjusting a unit of measurement of the measuring step for measuring one of the variables according to a measured level of the one variable;

calculating the current residual battery quantity every time one of the operational state flags are changed based on the residual battery capacity, the charging/discharging current, the battery cell voltage, and said operational state flags;

outputting a correction coefficient used for calculating the residual battery quantity wherein the calculating step calculates the residual battery quantity and factors the result by said correction coefficient and wherein said correction coefficient is a temperature dependent coefficient; and varying at least one of said variables in dependence on the type of battery cell.

24. The method for calculating the residual battery quantity as claimed in claim 23, wherein the residual battery quantity of said battery pack is related to the integrated discharge current and the residual battery quantity as calculated by the step of calculating is the remaining battery time.

25. The method for calculating the residual battery quantity as claimed in claim 23, further comprising the step of displaying the calculated residual battery quantity.

26. The method for calculating the residual battery quantity as claimed in claim 25, wherein said step of displaying displays said residual battery quantity on a liquid crystal panel and on a viewfinder.

27. The method for calculating the residual battery quantity as claimed in claim 25, wherein said step of displaying displays said residual battery quantity on a display.

28. The method for calculating the residual battery quantity as claimed in claim 25, wherein said step of displaying displays a numerical figure indicating said remaining battery time.

29. The method for calculating the residual battery quantity as claimed in claim 25, wherein said step of displaying displays a minute-based numerical figure indicating said remaining battery time.

30. A VCR apparatus with a built-in camera having coupled thereto a battery pack of a plurality of types of battery packs, wherein said battery pack is configured for outputting a residual battery capacity which is the remaining capacity of the battery pack, a charging/discharging current detection which is the present charging and discharging current value to/from the battery pack, a battery cell voltage which is the present voltage of the battery pack, and a value for operational state flags which designate an operational state of said VCR apparatus, said VCR apparatus being powered by said battery pack, comprising:

communication means for receiving the residual battery capacity information, the charging/discharging current detection information, the battery cell voltage detection information from the battery pack, and said operational state flags information; and calculation means for calculating the current residual battery quantity every time one of the operational state flags are changed based on the information from said battery pack received by said communication means, wherein said calculation means varies said variables in dependence on the type of battery pack, and the battery pack includes:

measurement means for measuring one of the variables;

means for adjusting a unit of measurement of the measurement means for measuring the one variable according to a measured level of the one variable; and means for outputting a correction coefficient used for calculating the residual battery quantity wherein said calculation means calculates the residual battery quantity and factors the result by said correction coefficient and wherein said correction coefficient is a temperature dependent coefficient.

31. The VCR apparatus as claimed in claim 30, wherein the residual battery quantity of said battery pack is related to the integrated discharge current and the residual battery quantity as calculated by the calculation means is the remaining battery time.

32. The VCR apparatus as claimed in claim 30, wherein the residual battery quantity as calculated by said calculating means is the remaining battery time of the VCR with the built-in camera.

33. The VCR apparatus as claimed in claim 30, wherein the residual battery quantity as calculated by said calculating means is the residual playback time of the VCR with the built-in camera.

34. The VCR apparatus according to claim 30, further comprising display means for displaying the residual battery quantity calculated by said calculation means.

35. The VCR apparatus as claimed in claim 34, wherein said display means has a liquid crystal panel and a viewfinder.

* * * * *